United States Patent
Fournel

(10) Patent No.: US 6,366,505 B1
(45) Date of Patent: Apr. 2, 2002

(54) DEVICE FOR CONTROLLING A TRANSLATOR-TYPE HIGH VOLTAGE SELECTOR SWITCH

(75) Inventor: Richard Fournel, Lumbin (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/628,149

(22) Filed: Jul. 28, 2000

(30) Foreign Application Priority Data

Jul. 30, 1999 (FR) .............................................. 99 09970

(51) Int. Cl.$^7$ ................................................ G11C 7/00
(52) U.S. Cl. ............................ 365/189.09; 365/185.23; 327/530
(58) Field of Search ........................... 365/189.09, 226, 365/185.23, 189.11; 327/530

(56) References Cited

U.S. PATENT DOCUMENTS 5,444,664 A * 8/1995 Kuroda et al. ............... 365/226
5,587,960 A * 12/1996 Ferris ..................... 365/230.03
6,181,606 B1 * 1/2001 Choi et al. .............. 365/185.23

FOREIGN PATENT DOCUMENTS

| EP | 0 774 838 A1 | 5/1997 |
| EP | 0 902 517 A2 | 3/1999 |
| GB | 2 201 059 A | 8/1988 |

OTHER PUBLICATIONS

French Search Report dated May 25, 2000 with Annex to French Application No. 99–09970.

* cited by examiner

Primary Examiner—Son Mai
(74) Attorney, Agent, or Firm—Lisa K. Jorgenson; Stephen Bongini; Fleit, Kain, Gibbons, Gutman & Bongini P.L.

(57) ABSTRACT

A control device is provided for controlling a selector switch of a high voltage input having at least one cascode stage with MOS transistors. The control device includes a reference voltage generation circuit and a control circuit. The reference voltage generation circuit generates reference voltages from the high voltage input and provides one or more output voltages for the biasing of the MOS transistors of the cascode stage. The control circuit controls the reference generation circuit on the basis of a binary control signal, so as to either set the bias voltages at the level of the logic supply voltages to enable the switching of the selector switch even at low values of the high voltage input, or to enable the bias voltages to be set by the reference generation circuit.

22 Claims, 5 Drawing Sheets

US 6,366,505 B1

DEVICE FOR CONTROLLING A TRANSLATOR-TYPE HIGH VOLTAGE SELECTOR SWITCH

CROSS-REFERENCE TO RELATED APPLICATIONS

This application is based upon and claims priority from prior French Patent Application No. 99-09970, filed Jul. 30, 1999, the entire disclosure of which is herein incorporated by reference.

BACKGROUND OF THE INVENTION

1. Field of the Invention

The present invention relates to electronic circuits, and more specifically to a device for controlling a translator-type high voltage selector switch.

2. Description of Related Art

Conventional non-volatile electrically programmable memories are programmed using a voltage with a level higher than the logic supply voltage Vcc of the integrated circuit. The level of this high programming voltage depends on the technology used for the integrated circuit. Typically, the high voltage is applied to an integrated circuit element (for example, applied to a row of a memory) using a high voltage selector switch, which is also known as a level translator. The selector switch receives a logic control signal and a high voltage input. Depending on the logic level (Vcc or zero) of the logic circuit signal, which in the case of a memory comes from a write control signal, either the ground or the high voltage input level is supplied to the output of the selector switch.

CMOS selector switches usually have two arms, and each arm has two series-connected transistors between the high voltage input and ground. The bottom transistors are N-type transistors and have their sources connected to ground. They are known as selector switch transistors because one of these transistors receives the selection-switching signal and the other receives the reverse selection-switching signal. These selection-switching signals are logic signals whose level is zero or Vcc. The top transistors are P-type transistors and have their sources connected to a node that receives the high voltage input. Each of the P-type transistors has its gate connected to the drain of the upper transistor of the other arm. They are also known as load transistors.

The selector switch operates as follows. Depending on the levels of the selection switching signals, there is always a selector switch N-type transistor in one arm that is off and a selector switch N-type transistor in the other arm that is on. The N-type transistor that is on draws its drain towards zero volts (the potential of its source), and the P-type transistor of the other arm, which has its gate connected to this drain, turns on. Therefore, the P-type transistor takes its own drain to the voltage of its source, which is the high voltage input level.

Thus, at each connection node of the drains of the N-type and P-type transistors of the same arm, there is either the ground level or the high voltage input level. Additionally, conventional selector switches usually have an intermediate stage between the stage of the top transistors and the stage of the bottom transistors. This intermediate stage includes one or more cascode-connected stages that enable the internal nodes of the selector switch to be limited to intermediate voltage levels so that no transistor of the selector switch receives any excessively high voltage at its terminals.

In some conventional selector switch circuits, all of the N-type or P-type transistors of the cascode stage are biased at their gate by the logic supply voltage Vcc. This bias limits the range of operation of the selector switch. In particular, the switching over of the selector switch to provide the high voltage input level at output can only be done when the level of the input is sufficiently high (i.e., higher than the logic supply voltage Vcc.

With thin-oxide MOS technologies, the switching operation of the selector switch under high voltage has harmful transient effects on the MOS transistors. Furthermore, if there is biasing of the gates of the cascode transistors at the logic supply voltage while there is a voltage dependent on the high voltage input at the drains and sources of the cascode transistors, there is no link between these two voltages. This can give rise to additional stresses if the difference between these two voltages becomes excessively high.

For these reasons, it is preferable to bias the gates of the cascode-connected transistors at a reference voltage that is produced from the high voltage input. This makes it is possible to control the voltage difference between this reference voltage and the other high voltage input because the former depends on the latter. Thus, better protection is provided. In the case of a cascode stage with N-type and P-type MOS transistors, the gates of the N-type transistors of the cascode stage are usually biased at a reference voltage $Vref_n$ that is higher than the reference voltage $Vref_p$ which biases the gate of the P-type transistors of the cascode stage. This makes it possible to reduce the lower switch-over limit of the selector switch.

An example of this type of cascode stage selector switch is shown in FIG. 1. As shown, the upper stage includes a P-type MOS transistor M1 in the first arm and another P-type MOS transistor M2 in the second arm. These transistors receive the high voltage input EHV at their source. The bottom stage includes an N-type MOS transistor M3 in the first arm and another N-type MOS transistor M4 in the second arm. These transistors have their source connected to ground GND. The cascode stage includes four MOS transistors: two P-type MOS transistors M5 and M6 (one in each arm beneath each upper transistor), and two N-type MOS transistors M7 and M8 (one in each arm above each lower transistor). The P-type MOS transistors M5 and M6 receive reference voltage $Vref_p$ at their gate. The N-type MOS transistors M7 and M8 receive reference voltage $Vref_n$ at their gate.

The output Vout of the selector switch is provided between the N-type and P-type cascode-connected transistors of one arm (i.e., at the drains of transistors M6 and M8). The gate of the lower transistor M3 of the first arm of the selector switch receives a selection switching logic signal IN and the gate of the lower transistor M4 of the second arm of the selector switch receives the reverse signal /IN. The circuit REF that generates the reference voltages $Vref_n$ and $Vref_p$ includes three MOS transistors M9, M10 and M11 series-connected between the high voltage Vpp and ground. The three transistors operate as resistors because each has its gate connected to its drain. In the exemplary circuit, thee transistors are P-type transistors. The reference voltages $Vref_n$ and $Vref_p$ are provided on the two sides of the middle transistor M10.

The cascode stage acts to limit the voltages experienced by the transistors to intermediate levels. Each P-type cascode transistor is biased so that it is always on. Thus, the source of the transistor, and hence the drain of the P-type load transistor to which it is connected, cannot go below $Vref_p - Vt_p$ (where $Vt_p$ is the threshold voltage of the P-type cascode transistor). Similarly, each N-type cascode transistor is biased so as to always remain on. Thus, each has its source, and therefore the drain of the switching transistor to which it is connected, cannot rise above $Vref_n - Vt_n$ (where $Vt_n$ is the threshold voltage of the N-type cascode transistor).

There will now be described a practical example in which the high voltage input of the selector switch is in the form of a pulse with a voltage build-up ramp as shown in curve 1 of FIG. 2. Thus, in this example, the voltage increases linearly from zero to its rated value Vpp (the slope of the increase may be linear, logarithmic, exponential, and so on). Curves 2 and 3 show the progression of the reference voltages $Vref_n$ and $Vref_p$. These curves show that the reference voltages follow the voltage build-up of the high voltage input EHV.

The differences between each of the reference voltages and the level of the high voltage input EHV at the beginning of the ramp (i.e., at the low voltage values of the input EHV) do not allow the transistors of the cascode stage to be conductive. At these low values of the high voltage input, the selector switch therefore cannot get switched. In one practical example in which the circuit is supplied by a Vcc of 3.3 volts, the level of the high voltage input should at least be higher than 3.8 volts so that it can switch over.

The switching at high values of the input EHV (i.e., values higher than Vcc) has the effect of contributing to the production of hot electrons. The repetition of selection switching commands greatly increases the quantity of these hot electrons, and ultimately causes deterioration in the characteristics of the transistors of the selector switch. For these reasons, conventional selector switches can withstand only a limited number of selection-switching operations.

SUMMARY OF THE INVENTION

In view of these drawbacks, it is an object of the present invention to overcome the above-mentioned drawbacks and to provide a device in which the selector switch will switch over at the low values of the high voltage input. Once the transistors have switched over, the level of the high voltage input can rise without causing any harm to the transistors.

One embodiment of the present invention provides a control device for controlling a selector switch of a high voltage input having at least one cascode stage with MOS transistors. The control device includes a reference voltage generation circuit and a control circuit. The reference voltage generation circuit generates reference voltages from the high voltage input and provides one or more output voltages for the biasing of the MOS transistors of the cascode stage. The control circuit controls the reference voltage generation circuit on the basis of a binary control signal, so as to either set the bias voltages at the level of the logic supply voltages to enable the switching of the selector switch even at low values of the high voltage input, or to enable the bias voltages to be set by the reference generation circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

A preferred embodiment of the present invention provides a device in which the selector switch will switches over at the low values of the high voltage input. Once the transistors have switched over, the level of the high voltage input can rise without causing any harm to these transistors. In one embodiment, the switching over at the low values of the high voltage input is produced by a control circuit that is controlled by a binary signal. Depending on whether the level of this signal is "1" or "0", the control circuit supplies voltages to bias the gates of the cascode transistors. The supplied voltages are either the logic supply voltage Vcc and ground, or the conventional reference voltages $Vref_n$ and $Vref_p$.

Thus, at the low values of the high voltage input, it is possible to use the levels of the logic supply voltages (i.e., Vcc and Gnd) as bias voltages of the cascode transistors so as to switch the selector switch at low voltage. With the gates of the cascode transistors biased at Vcc (NMOS) and at zero volts (PMOS), there is sufficient voltage to control the transistors. The switching can take place at low voltage and there is no longer a problem with the generation of hot electrons. Thus, the resistance of the selector switch is improved, and there are fewer constraints when designing these critical MOS transistors.

In the preferred embodiment of the present invention, the selector switch can always switch over at the high values of the high voltage input. Thus, it is possible to widen the range of operation of the selector switch towards the low values of the high voltage input, so as to improve its reliability and simplify its design rules. Once the switch over has taken place, there is a return to the usual operation of the reference voltage generation circuit REF. In particular, the output of the selector switch then follows the build-up in voltage of the high voltage input with the advantage of a biasing of the cascode transistors by the reference voltages $Vref_n$ and $Vref_p$ as a function of the high voltage input.

Figure 1:
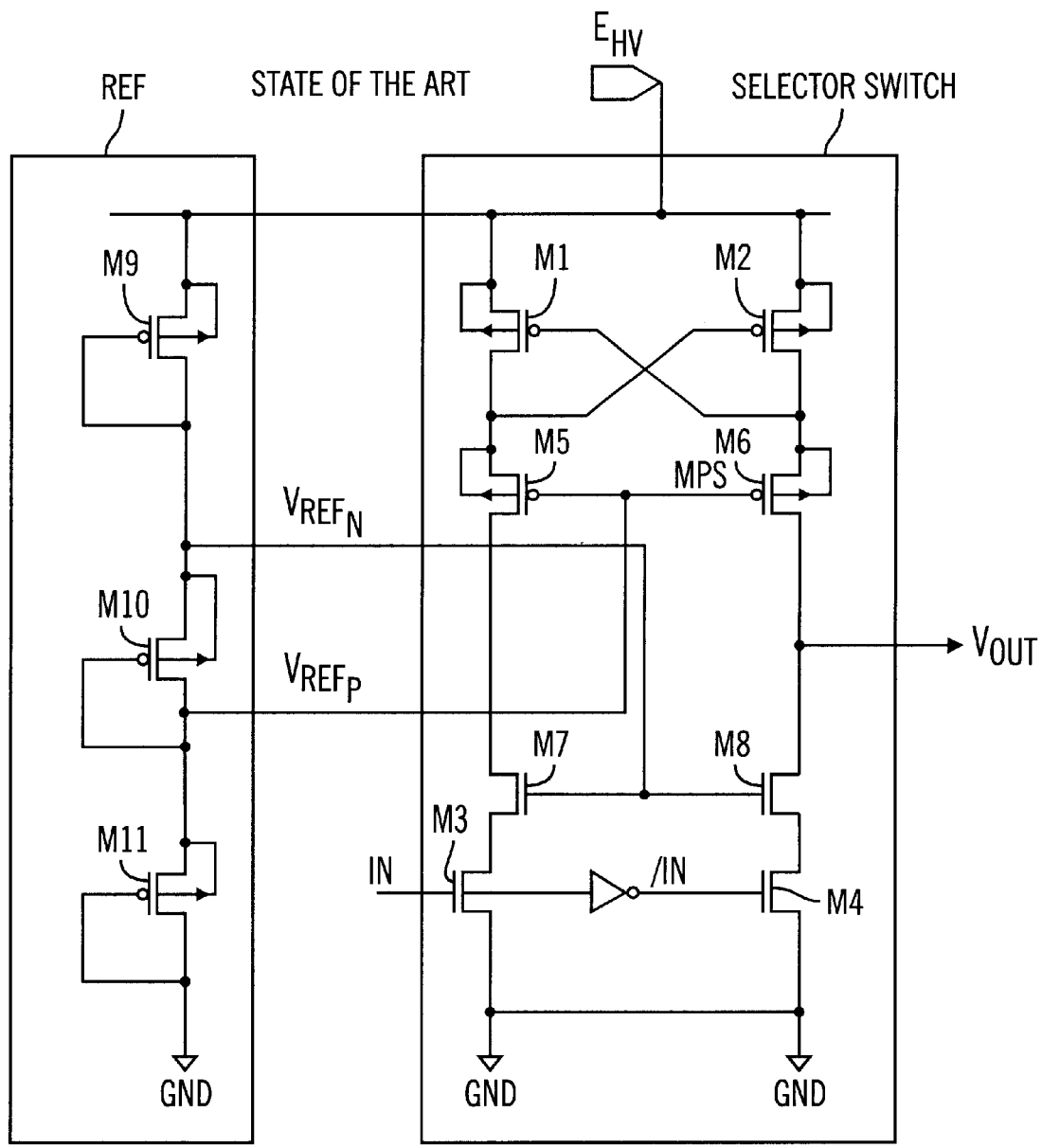
FIG. 1 shows a conventional high voltage selector switch with a cascode stage and a control circuit for generating reference voltages for transistors of the cascode stage.
Figure 2:
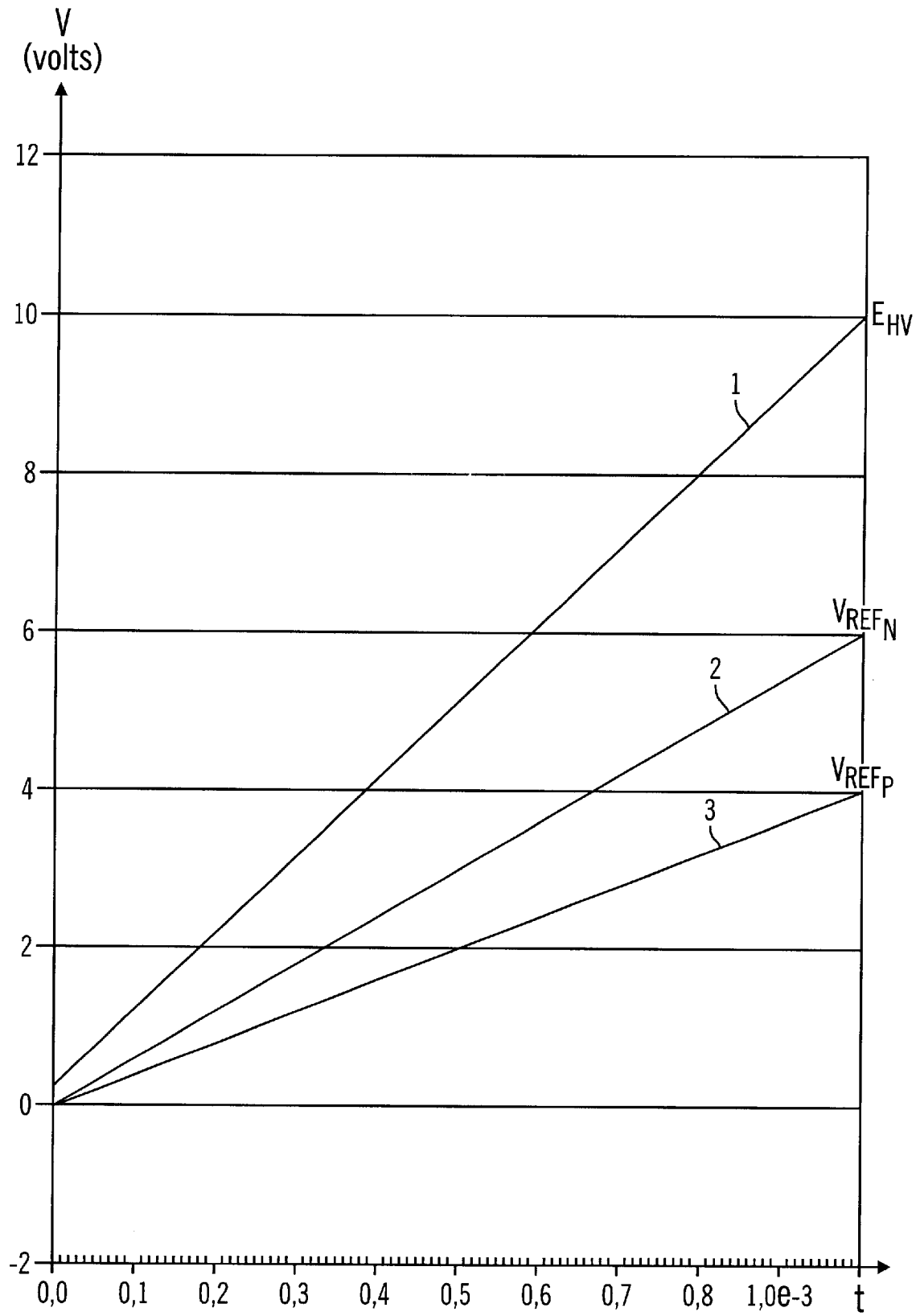
FIG. 2 shows curves for reference voltages during operation of the conventional circuit of FIG. 1.
Figure 3:
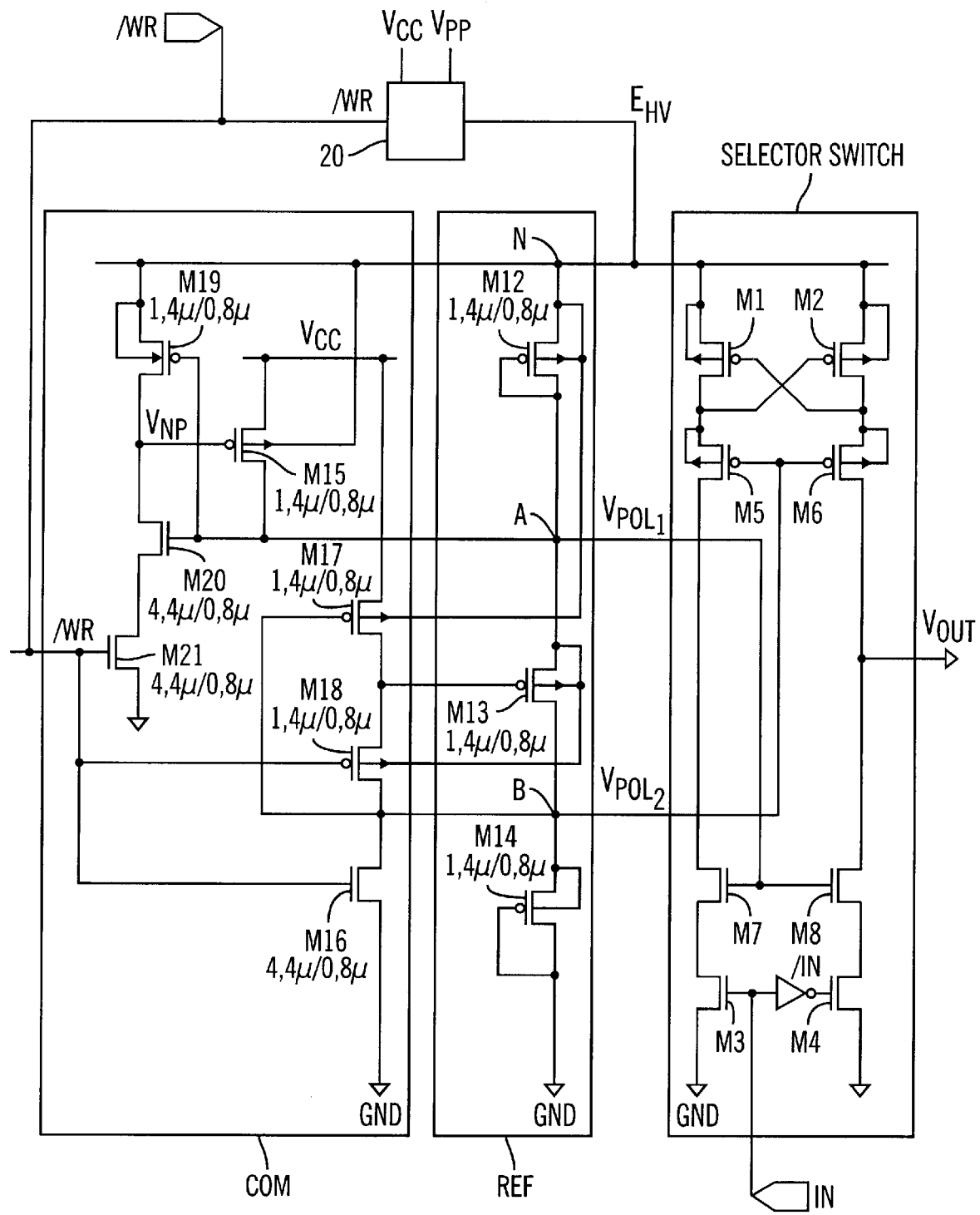
FIG. 3 shows a control circuit for a reference voltage generation circuit in accordance with one embodiment of the present invention.

FIG. 3 shows a device for controlling a selector switch of a high voltage input according to one embodiment of the present invention. Because the elements of the selector switch are identical to those described above with reference to FIG. 1, the common elements bear the same reference labels for clarity. The control device includes a reference voltage generation circuit REF and a control circuit COM.

The reference voltage generation circuit REF includes three P-type MOS transistors M12, M13, and M14 series-connected between node N, which receives the high voltage input EHV, and ground Gnd. However, only the first and third transistors M12 and M14 have their gates connected to their drains. The second transistor M13 is controlled by the control circuit COM. The second transistors has its drain and its source supply a first bias voltage $Vpol_1$ and a second bias voltage $Vpol_2$, respectively. These are the gate bias voltages for the transistors of the cascode stage or stages.

The control circuit COM makes it possible to control the gate, drain, and source voltages of the second transistor M13 depending on the level of a control signal /WR. More specifically, when the control signal /WR is at a first logic level (e.g., 1), the drain and the source of transistor M13 are set to Vcc and Gnd, respectively. Thus, $Vpol_1$=Vcc and $Vpol_2$=Gnd. When the control signal /WR is at the second logic level (e.g., 0), the drain and the source of transistor M13 are connected together so as to enable the reference circuit to set up the voltage levels at nodes A and B. Thus, $Vpol_1$=$Vref_n$ and $Vpol_2$=$Vref_p$.

Figure 6:
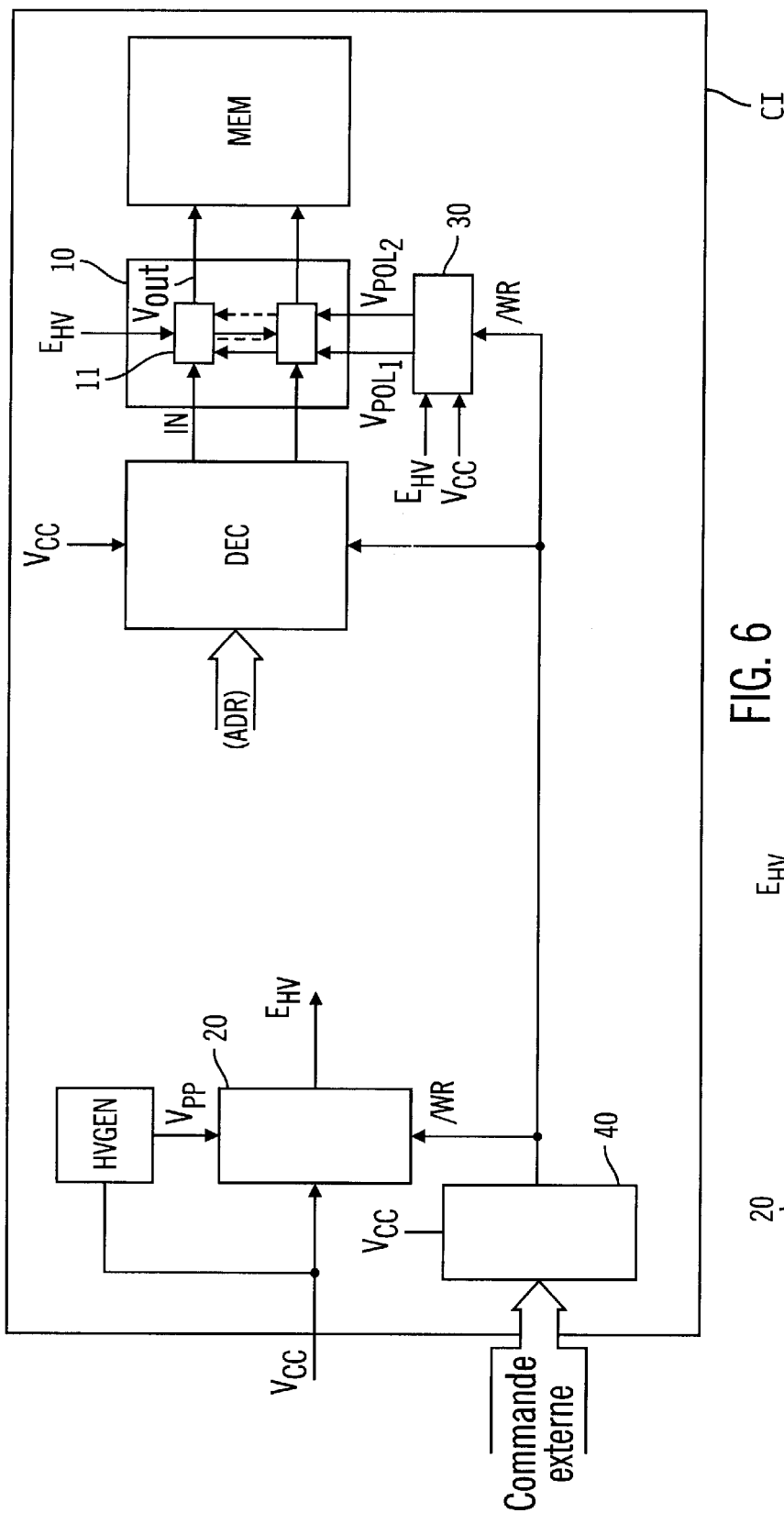
FIG. 6 shows a block diagram of an integrated circuit having a selector switch in accordance with the present invention to enable the programming of memory elements.

An exemplary application of a high voltage selector switch having a control circuit in accordance with the present invention is shown in FIG. 6. In this example, an integrated circuit CI includes a non-volatile electrically programmable memory array MEM. A decoder DEC controls access to the memory as a function of address and control signals (now shown). The output signals of the decoder are logic signals. To program the memory, it is necessary to apply a programming voltage. A circuit 10 of high voltage selector switches 11 is provided for this purpose between the decoder and the memory. The control input IN of each selector switch is given by one of the output signals of the decoder.

The selector switches receive a high voltage input EHV given by a high voltage multiplexer circuit 20, and receive the voltages for biasing the cascode transistors from a control device 30 according to an embodiment of the present invention. The multiplexer circuit 20 receives the logic supply voltage Vcc and a high voltage Vpp (e.g., supplied by a charge pump-type high voltage generator HVGEN). The multiplexer is controlled by a write signal /WR from a control circuit 40 of the integrated voltage as a function of external control signals. The write signal /WR is also applied to the control device 30 that gives the bias voltages for the cascode transistors to the selector switches.

Figure 4:
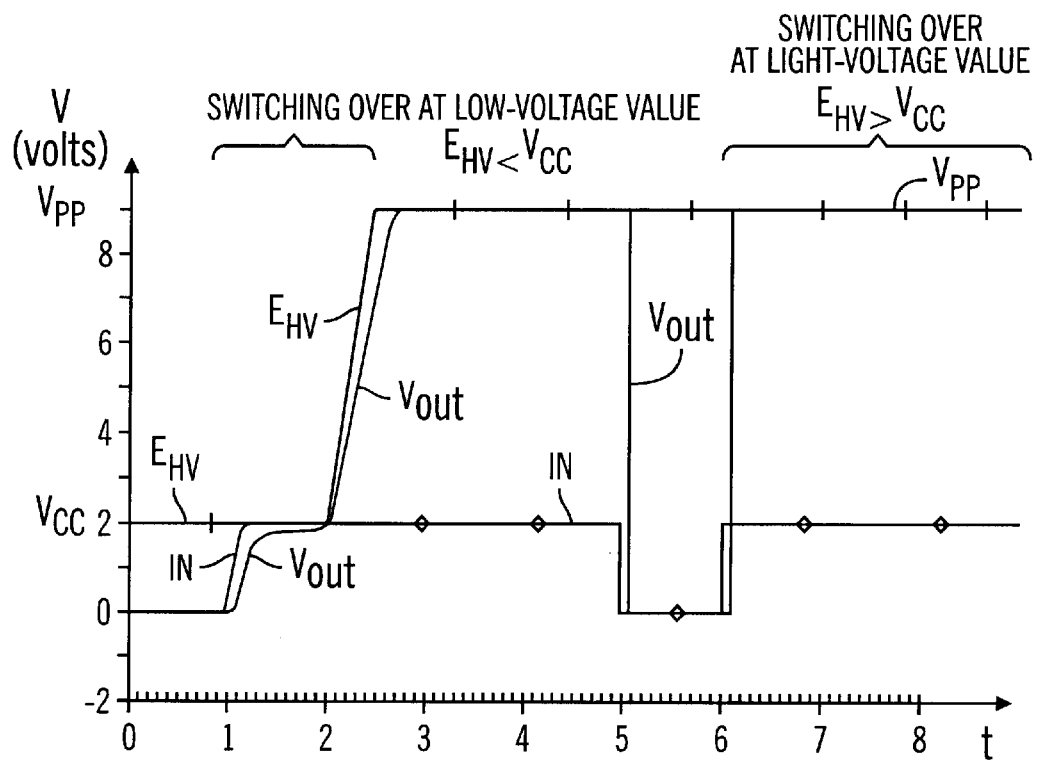
FIG. 4 shows the signal supplied at the output of the selector switch as a function of the selector switch control signal.
Figure 5:
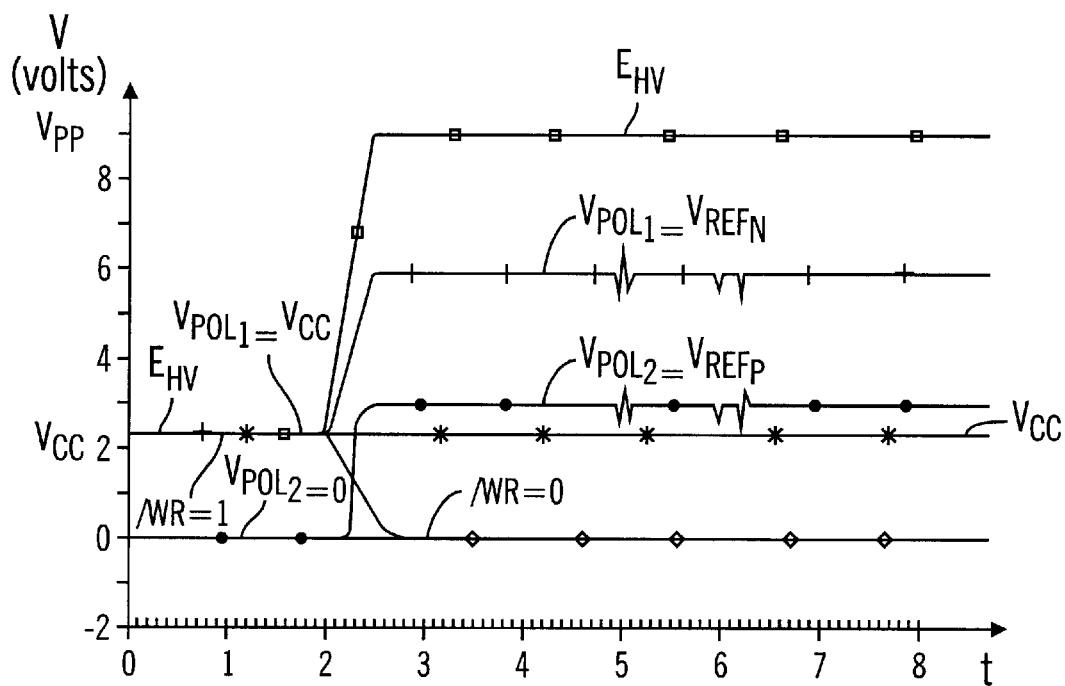
FIG. 5 shows the high voltage input, the control signal of the control circuit, and the curves of the reference voltages.

The operation of a selector switch having a control device in accordance with the present invention during a cycle for writing of memory elements is illustrated in FIGS. 4 and 5. In this practical example, the logic supply is at 2 volts (Vcc=2 volts). The signals IN, EHV, and Vout are shown in FIG. 4 and the signals /WR, $Vpol_1$, $Vpol_2$, and EHV are shown in FIG. 5. When the write signal /WR equals 1, the multiplexer 20 applies Vcc to the high voltage input EHV and the decoder is activated to deliver selection signals as a function of the received address signals (ADR).

If a switch of circuit 10 is taken, its selector switch control logic input IN is given by a decoder output. When this input IN changes from 0 to 1 to make the level of the high voltage input EHV switch over at the output node Vout of the selector switch, this input EHV is still at a level lower than or equal to Vcc. The bias voltages $Vpol_1$ and $Vpol_2$ are then set by the control device 30 at the levels of the logic supply voltages, which are respectively Vcc (2 volts in the example) and ground Gnd. When the write control signal /WR subsequently goes to its active write level (i.e., 0 in the example), the control device 30 changes its state to set the gate-drain connection of the second transistor M13 of the reference generation circuit (FIG. 3).

The conventional operation of the reference circuit is then produced, with $Vpol_1$=$Vref_n$ and $Vpol_2$=$Vref_p$. At the same time, the multiplexer 20 applies the programming voltage Vpp to the high voltage input EHV in the form of a pulse, with a voltage build-up ramp to build up the voltage from the previous level Vcc to Vpp. The bias voltages $Vpol_1$ and $Vpol_2$ then follow the build-up of the high voltage input EHV, as shown in FIG. 5. The output signal Vout also follows the high voltage input EHV.

The selector switch properly carries out the function of keeping the output information during the build-up of the high voltage input EHV. The disturbances on signals $Vref_n$ and $Vref_p$ as seen in FIG. 5 are related to the instances of the switching over of the selector switch (because of the capacitive effect of the MOS transistors M5 to M8). This exemplary application provides a good illustration of the principle of the logic control of a high voltage selector switch that is provided by the control device according to the present invention. In particular, the selector switch is controlled so that the selection switching is achieved when the level of the high voltage input EHV is at low values (EHV≦Vcc). Then, it is controlled so that it fulfills its function of holding the information on the output Vout in following the voltage build-up of the high voltage input EHV.

The selector switch can always operate conventionally and switch over to the high values (EHV>Vcc). The control device according to the present invention therefore makes it possible to widen the range of operation of the selector switch by enabling it to switch over not only in the high values, as conventionally, but also in the low values (EHV≦Vcc). In the application of the programming of memory elements, the present invention can be applied as much to the programming of elements of a memory array as to the programming of discrete memory elements distributed among the different internal circuits of an integrated circuit. For example, such different internal circuits may be electrically programmable fuses used in redundancy circuits or the like.

FIG. 3 shows a detailed view of one embodiment of a control circuit according to the present invention. The control circuit includes for MOS transistors M15, M16, M17, and M18. The P-type MOS transistor M15 is connected between the logic supply voltage Vcc and the first intermediate node A of the reference circuit REF, which is connected to the source of the transistor M13. The N-type MOS transistor M16 is connected between the second intermediate node B of the reference circuit, which is connected to the drain of the transistor M13, and ground Gnd.

The P-type MOS transistor M17 is connected between the logic supply voltage Vcc and the gate of transistor M13. The transistor M18 is connected between the gate of the second transistor and the second intermediate node B, which is connected to the drain of the transistor M13. Transistors M16 and M18 are controlled at their gate by the control signal /WR of the control circuit and transistor M15 is controlled by a signal Vnp referenced at the high voltage input EHV, coming from signal /WR but with a reverse logic. Transistor M17 is connected at its gate to the second intermediate node B.

The operation of this control circuit is as follows. When signal /WR is at "1", transistor M16 is on and draws the second intermediate node B to zero, and consequently draws the gate of transistor M17 to zero. The transistor M18 is off.

Thus, transistor M17 which is on, supplies the voltage Vcc to the gate of transistor M13, which is thus set in the off state. Transistor M15 is also on since signal Vnp is a logic signal that is the reverse of signal /WR. It therefore brings the supply voltage Vcc to the first intermediate node A. Since the transistor M13 is set in the on state by transistors M16, M17, and M18 of the control circuit, the intermediate nodes A and B are sustained at their respective levels Vcc and Gnd, regardless of the voltage level at the high voltage input.

When signal /WR goes to zero (corresponding to the voltage build-up of the high voltage input EHV from Vcc up to its nominal value Vpp), transistors M15 and M16 go to the off state, and consequently transistor M17 also goes to the off state. Transistor M18 comes on and actively connects the gate of transistor M13 to the second intermediate node B (i.e., its drain). Transistor M13 is then connected as a diode like the other transistors M12 and M14 of the reference circuit. The normal operation of the reference circuit is then seen. In particular, the voltages at nodes A and B follow the voltage build-up of the high voltage input EHV.

Since transistor M15 of the control circuit is connected between the logic supply voltage Vcc and node A, and since transistor M12 of the reference circuit is connected between the high voltage input EHV and node A, when this high voltage EHV reaches the high values, it is necessary to be sure that transistors M15 is truly off so as not to send the high voltage to the logic supply voltage Vcc. Therefore, transistor M15 must receive at its gate, not the high level corresponding to the logic supply voltage Vcc, but the level from the high voltage input EHV. When the high voltage input reaches its rated value Vpp, this value Vpp is found at the gate of transistor M15.

In this exemplary circuit, this is accomplished by an inverter circuit with three MOS transistors. A first P-type MOS transistor M19, a second N-type MOS transistor M20, and a third N-type MOS transistor M21 are series-connected between node N, which is the high voltage input EHV, and ground Gnd. Transistor M21 is controlled at its gate by the control signal /WR. Transistors M20 and M19 have their gates connected together at the first intermediate node A. The reverse logic signal Vnp is referenced at EHV by the inverter and is given by the series connection point between two transistors M19 and M20. It is the signal applied to the gate of the transistor M15.

The operation of the circuit is simple. When the binary signal /WR is at 1, transistor M21 is on and draws the source of transistor M20 to the ground. The node A is at Vcc. Since the high voltage input EHV at this time is at a lower voltage level (in the example, it is at Vcc as compared to FIG. 4), transistor M19 is off. Transistor M20 is on. The voltage at the gate of transistor M15 is therefore zero (Vnp=0). The sizes of the MOS transistors M19, M20, and M21 are defined so that even if the high voltage input EHV takes a value greater than Vcc, Vnp remains below Vcc−Vtp. Thus, the selector switch works even in the high values of the high voltage input (i.e., it can switch over).

When the binary signal /WR is at 0 and the high voltage input EHV rises from Vcc to Vpp, transistor M21 is not on and places the source of transistor M20 at a floating potential. The potential Vnp is not drawn to ground. Hence, transistor M15 is off. If the input EHV is at Vpp, node A is biased by transistor M12 at a voltage below Vpp−Vtp. The transistor M19 is on and Vnp is drawn to Vpp. The stable position is given by Vnp=Vpp, M15 is off, and $Vref_n$ below Vpp−Vtp. In FIG. 3, the bulks of transistors M15, M17, M19 and M12 are biased by the high voltage input EHV, and the bulks of transistors M18 and M12 are biased by the voltage at the first intermediate node A, for better behavior under voltage.

Accordingly, the present invention improves the range of operation and reliability of the high voltage selector switches by enabling its selection switching in the low values of the high voltage input. While in practice it is somewhat costly to produce because of the additional transistors (in the exemplary embodiment there are seven additional transistors), it is possible to have only one control device that includes the reference circuit and its control circuit for several switches, as shown in FIG. 6.

Its use in an integrated circuit to apply a high voltage pulse for the programming of non-volatile electrically programmable memory elements (as is shown in FIG. 6) is particularly simple to implement. In this type of application, the write signal /WR can control both the circuit which gives the high voltage input (element 20 of FIG. 6) and the control device. It is therefore enough to modify the sequencing of the control circuit of the memory so that it produces an active level of signal IN just a little before the passage to the active level of the write signal /WR, so that the selector switch gets switched over just slightly before the write pulse arrives at the input EHV.

Figure 7:
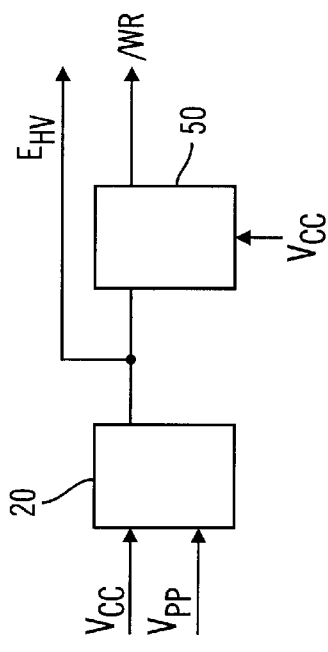
FIG. 7 shows an alternative embodiment for a portion of the circuit of FIG. 6.

In one alternative embodiment shown in FIG. 7, a voltage detector 50 is placed on the input EHV to supply the binary signal /WR so that /WR=1 when the level of the high voltage input is below a specified threshold level (e.g., of about Vcc) and /WR=0 when the level of the high voltage input is above this threshold level. In this alternative embodiment, the input EHV does not necessarily have the shape with two steps Vcc and Vpp shown in FIG. 4. This alternative embodiment can be advantageously applied when the voltage build-up of the input EHV is slow enough to enable the detector to control the switching over of the selector switch before the input EHV reaches the detection threshold.

The present invention is not limited to the embodiments and applications described above. The present invention can easily be extended to control devices such as a control circuit capable of setting the voltage levels Vcc and Gnd as bias voltages of the cascode transistors of the selector switch in the low values of voltage of the signal EHV. Furthermore, the present invention can be applied in general to MOS selector switches with one or more cascode stages, using one or both bias voltages depending on whether the cascode stages are N and P-type MOS transistor stages, N-type MOS transistor stages, or P-type MOS transistor stages. The present invention is particularly suited to integrated circuits having non-volatile electrically programmable memories.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A control device for controlling a selector switch of a high voltage input having at least one cascode stage with MOS transistors, said control device comprising:
   a reference voltage generation circuit for generating reference voltages from the high voltage input and for providing one or more output voltages for the biasing of the MOS transistors of the cascode stage; and
   a control circuit for controlling the reference voltage generation circuit on the basis of a binary control signal, so as to either set the bias voltages at the level of the logic supply voltages to enable the switching of the selector switch even at low values of the high voltage input, or to enable the bias voltages to be set by the reference voltage generation circuit.

2. The control device as defined in claim 1, wherein the reference voltage generation circuit comprises:
   a first P-type MOS transistor connected between a node that receives the high voltage input and a first intermediate node, with its gate connected to its drain;
   a second P-type MOS transistor connected between the first intermediate node and a second intermediate node; and
   a third P-type MOS transistor connected between the second intermediate node and ground, with its gate connected to its drain,
   wherein a bias voltage is supplied from each of the intermediate nodes.

3. The control device as defined in claim 2, wherein the control circuit comprises control means for controlling the second transistor so as to either set the first and second intermediate nodes at the levels of the logic supply voltages, or actively connect the gate and the drain of the second transistor to enable the voltage levels to be set on the first and second intermediate nodes by the reference voltage generation circuit.

4. The control device as defined in claim 3, wherein the control means comprises:
   a first MOS transistor connected between the logic supply voltage and the first intermediate node;
   a second MOS transistor connected between the second intermediate node and ground;
   a third MOS transistor connected between the logic supply voltage and the gate of the second transistor of the reference voltage generation circuit; and
   a fourth MOS transistor connected between the gate of the second transistor of the reference voltage generation circuit and the second intermediate node,
   wherein the first, second, and fourth transistors are controlled by the binary control signal, and
   the third transistor is controlled by the second intermediate node.

5. The control device as defined in claim 4,
   wherein the first, third, and fourth transistors of the control circuit are P-type MOS transistors,
   the second transistor is an N-type MOS transistor,
   the second and fourth transistors receive the binary control signal at their gate, and
   the first transistor receives a reverse logic signal.

6. The control device as defined in claim 5, wherein the reverse logic signal is referenced at the high voltage input.

7. The control device as defined in claim 5, wherein the reverse logic signal is supplied by an inverter circuit comprising:
   a first P-type MOS transistor;
   a second N-type MOS transistor; and
   a third N-type MOS transistor,
   the first, second, and third transistors of the inverter circuit are series-connected between the high voltage input and ground,
   the series connection point between the first and second transistors supplies the reverse logic signal,
   the first and second transistors have their gates connected together and to the first intermediate node, and
   the third transistor is controlled by the binary control signal.

8. An integrated circuit comprising:
   non-volatile, electrically programmable memory elements;
   at least one selector switch of a high voltage input for programming the memory elements; and
   at least one control device for controlling the at least one selector switch,
   wherein the at least one selector switch includes at least one cascode stage with MOS transistors, and
   the control device includes:
      a reference voltage generation circuit for generating reference voltages from the high voltage input and for providing one or more output voltages for the biasing of the MOS transistors of the cascode stage; and
      a control circuit for controlling the reference voltage generation circuit on the basis of a binary control signal, so as to either set the bias voltage at the level of the logic supply voltages to enable the switching of the selector switch even at low values of the high voltage input, or to enable the bias voltages to be set by the reference voltage generation circuit.

9. The integrated circuit as defined in claim 8, wherein the reference voltage generation circuit comprises:
   a first P-type MOS transistors connected between a node that receives the high voltage input and a first intermediate node, with its gate connected to its drain;
   a second P-type MOS transistor connected between the first intermediate node and a second intermediate node; and
   a third P-type MOS transistor connected between the second intermediate node and ground, with its gate connected to its drain,
   wherein a bias voltage is supplied from each of the intermediate nodes.

10. The integrated circuit as defined in claim 9, wherein the control circuit comprises control means for controlling the second transistor so as to either set the first and second intermediate nodes at the levels of the logic supply voltages, or actively connect the gate and the drain of the second transistor to enable the voltage levels to be set on the first and second intermediate nodes by the reference voltage generation circuit.

11. The integrated circuit as defined in claim 10, wherein the control means comprises:
   a first MOS transistor connected between the logic supply voltage and the first intermediate node;
   a second MOS transistor connected between the second intermediate node and ground;
   a third MOS transistor connected between the logic supply voltage and the gate of the second transistor of the reference voltage generation circuit; and a fourth MOS transistor connected between the gate of the second transistor of the reference voltage generation circuit and the second intermediate node, wherein the first, second, and fourth transistors are controlled by the binary control signal, and the third transistor is controlled by the second intermediate node.

12. The integrated circuit as defined in claim 11, wherein the first, third, and fourth transistors of the control circuit are P-type MOS transistors, the second transistor is an N-type MOS transistor, the second and fourth transistors receive the binary control signal at their gate, and the first transistor receives a reverse logic signal.

13. The integrated circuit as defined in claim 12, wherein the reverse logic signal is referenced at the high voltage input.

14. The integrated circuit as defined in claim 12, wherein the reverse logic signal is supplied by an inverter circuit comprising:

a first P-type MOS transistor;

a second N-type MOS transistor; and a third N-type MOS transistor, the first, second, and third transistors of the inverter circuit are series-connected between the high voltage input and ground, the series connection point between the first and second transistors supplies the reverse logic signal, the first and second transistors have their gates connected together and to the first intermediate node, and the third transistor is controlled by the binary control signal.

15. The integrated circuit as defined in claim 8, further comprising a control device for a plurality of selector switches.

16. The integrated circuit as defined in claim 8, further comprising means for supplying to the high voltage input either the logic supply voltage or a programming voltage in the form of a ramp, the means for supplying and the control circuit being controlled by the same binary control signal.

17. The integrated circuit as defined in claim 8, further comprising a voltage detector for supplying the binary control signal by comparing the level of the high voltage input with a defined threshold.

18. A method for controlling a selector switch of a high voltage input having at least one cascode stage with MOS transistors, said method comprising the steps of:

generating reference voltages from the high voltage input;

providing one or more output voltages for the biasing of the MOS transistors of the cascode stage; and controlling the output voltages that are provided on the basis of a binary control signal, so as to either set the bias voltages at the level of the logic supply voltages to enable the switching of the selector switch even at low values of the high voltage input, or to enable the bias voltages to be set by the reference voltages that are generated.

19. The control device as defined in claim 1, wherein when the control circuit controls the reference voltage generation circuit so as to enable the bias voltage to be set by the reference voltage generation circuit, the reference voltage generation circuit supplies the reference voltages that are generated as the bias voltages for the biasing of the MOS transistors of the cascode stage.

20. The integrated circuit as defined in claim 8, wherein the selector switch switches between outputting substantially ground and outputting substantially the high voltage input.

21. The method as defined in claim 18, wherein the controlling step includes the sub-step of:

when the bias voltages are enabled to be set by the reference voltages that are generated, supplying the reference voltage that are generated as the bias voltages for the biasing of the MOS transistors of the cascode stage.

22. The method as defined in claim 18, wherein the controlling step includes the sub-step of:

when the bias voltages are set at the level of the logic supply voltages, setting at least one of the bias voltages at the level of Vcc and setting at least another of the bias voltages at the level of ground.

* * * * *